(12) United States Patent
Li et al.

(10) Patent No.: US 11,562,908 B2
(45) Date of Patent: Jan. 24, 2023

(54) DIELECTRIC STRUCTURE TO PREVENT HARD MASK EROSION

(71) Applicant: International Business Machines Corporation, Armonk, NY (US)

(72) Inventors: Tao Li, Albany, NY (US); Ekmini Anuja De Silva, Slingerlands, NY (US); Tsung-Sheng Kang, Ballston Lake, NY (US); Praveen Joseph, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/860,423

(22) Filed: Apr. 28, 2020

(65) Prior Publication Data

US 2021/0335618 A1 Oct. 28, 2021

(51) Int. Cl.
*H01L 21/308* (2006.01)
*H01L 27/092* (2006.01)
(Continued)

(52) U.S. Cl.
CPC ...... *H01L 21/3085* (2013.01); *H01L 21/3081* (2013.01); *H01L 21/3086* (2013.01);
(Continued)

(58) Field of Classification Search
None
See application file for complete search history.

(56) References Cited

U.S. PATENT DOCUMENTS

| 7,470,616 B1 | 12/2008 | Akinmade-Yusuff et al. |
| 8,815,670 B2 | 8/2014 | Basker et al. |

(Continued)

FOREIGN PATENT DOCUMENTS

| EP | 3399544 A1 | 11/2018 |
| KR | 20040077051 A | 9/2004 |
| WO | WO2010022969 A1 | 3/2010 |

OTHER PUBLICATIONS

Xiang et al., "Introduction of Pre-etch Deposition Techniques in EUV Patterning," Proc. of SPIE, vol. 10589 (Apr. 2018) (13 pages).
(Continued)

*Primary Examiner* — Hsien Ming Lee
(74) *Attorney, Agent, or Firm* — Abdy Raissinia; Michael J. Chang, LLC

(57) ABSTRACT

A novel dielectric cap structure for VTFET device fabrication is provided. In one aspect, a method of forming a VTFET device includes: patterning fins in a substrate using fin hardmasks, including a first fin(s) and a second fin(s); depositing a liner over the fins and the fin hardmasks; selectively forming first hardmask caps on top of the fin hardmasks/liner over the first fin(s); forming first bottom source and drain at a base of the first fin(s) while the fin hardmasks/liner over the first fin(s) are preserved by the first hardmask caps; selectively forming second hardmask caps on top of the fin hardmasks/liner over the second fin(s); and forming second bottom source and drains at a base of the second fin(s) while the fin hardmasks/liner over the second fin(s) are preserved by the second hardmask caps. A device structure is also provided.

20 Claims, 9 Drawing Sheets

(51) Int. Cl.
*H01L 29/08* (2006.01)
*H01L 29/78* (2006.01)
*H01L 21/8238* (2006.01)
*H01L 29/66* (2006.01)

(52) U.S. Cl.
CPC ............... *H01L 21/823814* (2013.01); *H01L 21/823864* (2013.01); *H01L 21/823885* (2013.01); *H01L 27/092* (2013.01); *H01L 29/0847* (2013.01); *H01L 29/66553* (2013.01); *H01L 29/66666* (2013.01); *H01L 29/7827* (2013.01)

(56) References Cited

U.S. PATENT DOCUMENTS

| | | | |
|---|---|---|---|
| 9,450,095 B1* | 9/2016 | Bergendahl | H01L 21/823814 |
| 9,595,441 B2 | 3/2017 | deVilliers et al. | |
| 10,109,583 B2 | 10/2018 | Bristol et al. | |
| 10,262,890 B1 | 4/2019 | Xu et al. | |
| 2015/0217330 A1 | 8/2015 | Haukka et al. | |
| 2016/0329207 A1 | 11/2016 | Mohanty et al. | |
| 2017/0342553 A1 | 11/2017 | Yu et al. | |
| 2018/0012752 A1 | 1/2018 | Tapily | |
| 2018/0239244 A1 | 8/2018 | Raley et al. | |
| 2018/0358269 A1* | 12/2018 | Bao | H01L 21/823456 |

OTHER PUBLICATIONS

Miyawaki et al., "Highly Selective Etching of SiO2 over Si3N4 and Si in Capacitively Coupled Plasma Employing C5HF7 Gas," Japanese Journal of Applied Physics 52 (2013) (Published Dec. 2012) (Abstract 3 total pages).

English translation of KR20040077051A, Sep. 4, 2004 by Chae Min Cheol (6 pages).

* cited by examiner

DIELECTRIC STRUCTURE TO PREVENT HARD MASK EROSION

FIELD OF THE INVENTION

The present invention relates to vertical transport field-effect transistor (VTFET) devices, and more particularly, to a dielectric cap structure for the VTFET device fabrication that prevents hard mask erosion during etch.

BACKGROUND OF THE INVENTION

As opposed to planar complementary metal-oxide-semiconductor (CMOS) devices, vertical transport field-effect transistor (VTFET) devices are oriented with a vertical fin channel disposed on a bottom source and drain and a top source and drain disposed on the fin channel. VTFET devices have been pursued as a potential device option for scaling CMOS to the 5 nanometer (nm) node and beyond.

During VTFET device fabrication, the vertical fin channels for devices of one polarity (i.e., either n-channel FET (NFET) or p-channel FET (PFET)) are masked, while the bottom source and drains are formed on the opposite device. The mask is removed and the process is repeated to form the bottom source and drains of the previously masked devices.

The masking is typically done using materials such an organic planarizing layer (OPL) material. However, during the etch to open the OPL material over the NFET or PFET fins a substantial erosion of the fin hardmasks often occurs. Depending on the configuration of the fin hardmasks, this erosion can undesirably expose underlying hardmask layers.

Further, during formation of the bottom source and drains a pre-epi clean etch is typically performed prior to growth of the epitaxial source and drains at the base of the fins. This pre-epi clean can cause further erosion of the fin hardmasks, especially when the underlying layers of the hardmask are already exposed by the OPL open.

Thus, techniques for preventing hardmask erosion during VTFET device fabrication would be desirable.

SUMMARY OF THE INVENTION

The present invention provides a novel dielectric cap structure for vertical transport field-effect transistor (VTFET) device fabrication that prevents hard mask erosion during etch. In one aspect of the invention, a method of forming a VTFET device is provided. The method includes: patterning fins in a substrate using fin hardmasks, the fins including at least one first fin and at least one second fin; depositing a liner over the fins and the fin hardmasks; selectively forming first hardmask caps on top of the fin hardmasks and the liner over the at least one first fin; forming first bottom source and drains at a base of the at least one first fin while the fin hardmasks and the liner over the at least one first fin are preserved during formation of the first bottom source and drains by the first hardmask caps; selectively forming second hardmask caps on top of the fin hardmasks and the liner over the at least one second fin; and forming second bottom source and drains at a base of the at least one second fin while the fin hardmasks and the liner over the at least one second fin are preserved during formation of the second bottom source and drains by the second hardmask caps.

In another aspect of the invention, a device structure is provided. The device structure includes: fins on a substrate, the fins including at least one first fin and at least one second fin; fin hardmasks disposed over the fins; a liner disposed over the fins and the fin hardmasks; and hardmask caps disposed selectively on top of the fin hardmasks and the liner over the at least one first fin, over the at least one second fin, or over both the at least one first fin and the at least one second fin.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for preventing hardmask erosion during vertical transport field-effect transistor (VTFET) device fabrication through the use of a selective cap placed at the tops of the fin hardmasks. As will be described in detail below, embodiments are contemplated herein where this hardmask cap is placed either before or after the organic planarizing layer (OPL) open. Advantageously, use of the present hardmask caps compensates for erosion of the fin hardmasks that occurs during OPL open and processes such as the pre-epi clean performed prior to bottom source and drain epitaxy. As a result, the fins remain covered by hardmask protecting them from potentially damaging conditions during subsequent processing steps.

In a first exemplary embodiment, the hardmask caps are selectively placed on the tops of the fin hardmasks prior to OPL open. Thus, in this case, the hardmask caps will advantageously compensate for hardmask loss during the subsequently OPL open stage and ensure that the fins remain fully protected. This exemplary embodiment is now described by way of reference to FIGS. 1-12.

Figure 1:
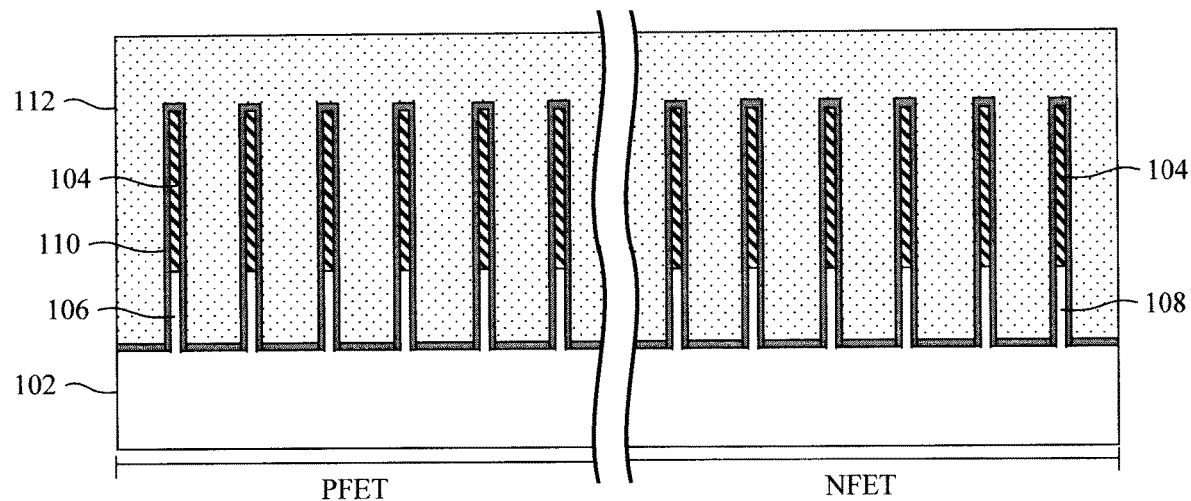
FIG. 1 is a cross-sectional diagram illustrating fin hardmasks having been used to pattern at least one first fin and at least one second fin in a substrate, a conformal liner having been deposited over the fin hardmasks, first/second fins, and on the surface of substrate in between the first/second fins, and the first/second fins having been surrounded/buried in a first organic planarizing layer (OPL) according to an embodiment of the present invention.

As shown in FIG. 1, the process begins with the patterning of at least one first fin 106 and at least one second fin 108 in a substrate 102. To do so, a plurality of fin hardmasks 104 are first formed on the substrate 102 marking the footprint and location of the fins 106 and 108. A directional (anisotropic) etching process such as reactive ion etching (RIE) can then be used to transfer the pattern from fin hardmasks 104 to the underlying substrate 102. Fin hardmasks 104 can be patterned using a patterning technique such as lithography followed by an etching process. Suitable etching processes include, but are not limited to, a directional (anisotropic) etching process such as RIE. Alternatively, fin hardmasks 104 can be formed by other suitable techniques, including but not limited to, sidewall image transfer (SIT), self-aligned double patterning (SADP), self-aligned quadruple patterning (SAQP), and other self-aligned multiple patterning (SAMP).

According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

Fins 106 will serve as the vertical fin channels of a VTFET device of a first polarity (i.e., n-channel FET (NFET) or p-channel FET (PFET) devices), and fins 108 will serve as the vertical fin channels of a VTFET device of a second, opposite polarity (i.e., PFET or NFET devices). Thus, for example, if fins 106 serve as the vertical fin channels of a PFET, then fins 108 serve as the vertical fin channels of an NFET. Conversely, if fins 106 serve as the vertical fin channels of an NFET, then fins 108 serve as the vertical fin channels of a PFET. In the present example, the six fins 106 on the left are arbitrarily chosen as the PFET fins and the six fins on the right are arbitrarily chosen as the NFET fins. Of course, the number of fins 106 and 108 shown is merely an illustrative example and embodiments are contemplated herein where more, or fewer, fins 106 and/or fins 108 than shown are employed, including situations where a single fin 106 and/or a single fin 108 is present.

Further, it is not a requirement that an equal number of fins 106 and fins 108 are present, and embodiments are contemplated herein where a number of the fins 106 differs from a number of the fins 108, and vice versa.

Following patterning of the fins 106/108 in substrate 102, a conformal liner 110 is deposited over the fin hardmasks 104, fins 106 and 108, and on the surface of substrate 102 in between the fins 106/108. See FIG. 1. A process such as chemical vapor deposition (CVD), atomic layer deposition (ALD) or physical vapor deposition (PVD) can be used to deposit the liner 110. For ease and clarity of depiction, the fins hardmasks 104 and the liner 110 are shown using single objects such as single block for each of the fin hardmasks 104 and single line for liner 110. While the fins hardmasks 104 and/or liner 110 can each be a single layer, in practice these structures can also contain a combination or stack of layers. For instance, each of the fin hardmasks 104 and/or the liner 110 can contain a stack of layers formed from a combination of oxide materials such as silicon oxide (SiOx) and/or nitride materials such as silicon nitride (SiN).

By way of example only, the following are some non-limiting examples of possible fin hardmasks 104 and liner 110 combinations that may be employed in accordance with the present techniques. In one exemplary embodiment, the fin hardmasks 104 are formed from a nitride hardmask material such as SiN, while the liner 110 is formed from an oxide liner material such as SiOx. In that case, the (single layer) liner 110 has a thickness of from about 5 nanometers (nm) to about 10 nm and ranges therebetween. Conversely, in another exemplary embodiment, the fin hardmasks 104 are formed from an oxide hardmask material such as SiOx, while the liner 110 is formed from a nitride liner material such as SiN. In that case, the (single layer) liner 110 has a thickness of from about 5 nm to about 10 nm and ranges therebetween.

In yet another exemplary embodiment, the hardmasks 104 and liner 110 each contain a stack of materials configured, e.g., as an oxide/nitride/oxide or nitride/oxide/nitride stack. For instance, each of hardmasks 104 can be formed from a nitride/oxide/nitride hardmask stack such as SiN/SiOx/SiN while the liner 110 is formed from an oxide/nitride/oxide liner stack such as SiOx/SiN/SiOx. In that case, each layer of the liner 110 stack has a thickness of from about 2 nm to about 4 nm and ranges therebetween. Conversely, each of hardmasks 104 can be formed from an oxide/nitride/oxide hardmask stack such as SiOx/SiN/SiOx while the liner 110 is formed from a nitride/oxide/nitride liner stack such as SiN/SiOx/SiN. In that case, each layer of the liner 110 stack has a thickness of from about 2 nm to about 4 nm and ranges therebetween.

As shown in FIG. 1, the fins 106 and 108 are then surrounded/buried in a (first) OPL 112. A casting process such as spin-coating or spray coating can be employed to deposit the OPL 112 over the fins 106 and 108. Following deposition, the OPL 112 can be planarized using a process such as chemical-mechanical polishing (CMP).

The OPL 112 is then recessed below tops of fin hardmasks 104/liner 110 such that a top of the (recessed) OPL 112 is below the tops of the fin hardmasks 104/liner 110. See FIG. 2. According to an exemplary embodiment, the OPL 112 is recessed below the tops of fin hardmasks 104/liner 110 using an oxygen ($O_2$)/sulfur dioxide ($SO_2$)-based plasma etching process. At this point in the process, only the tops of the fin hardmasks 104/liner 110 will be exposed. As will be described in detail below, the hardmask caps will be formed on these exposed tops of the fin hardmasks 104/liner 110. However, in order to enable selective formation of the hardmask caps only on the fin hardmasks 104/liner 110 at the tops of fins 106 and 108 (i.e., and not on the recessed OPL 112), a (first) capping layer 202 is first formed on the surface of the recessed OPL 112 in between the tops of the fin hardmasks 104/liner 110. See FIG. 2.

According to an exemplary embodiment, capping layer 202 is formed by grafting a polymer monolayer (i.e., a layer one atom thick) onto the surface of the recessed OPL 112 using a polymer brush technique. In this manner, the capping layer will be selectively grafted onto the exposed surfaces of the OPL 112 in between the tops of the fin hardmasks 104/liner 110 (i.e., not on the exposed surfaces of the fin hardmasks 104/liner 110 at the tops of fins 106 and 108). According to an exemplary embodiment, capping layer 202 is formed from a polymer brush/self-assembled material (SAM) which is formed with a functional head group that binds to pendant groups the OPL 112 such as alkyne groups and has an organic tail having one or more hydrophobic repeating units such alkene, styrene and/or methyl styrene moieties. The molecular weight of the polymer brush/self-assembled material (SAM) can range from about 500 grams per mole (g/mol) to about 5000 g/mol and ranges therebetween. A casting process such as spin-coating can be employed to deposit a coating of the polymer brush material onto recessed OPL 112 which will self-assemble into a monolayer (as the capping layer 202) coating the recessed OPL 112.

Advantageously, the polymer brush material(s) provided above modify the surface energy properties of the OPL 112 to which they are grafted. Namely, these polymer brush materials render the surface of OPL 112 hydrophobic, thereby suppressing the chemical deposition of the dielectric materials that will be used for the fin hardmask caps (see below). Thus, the hardmask caps will only form on the fin hardmasks 104/liner 110 at the tops of fins 106 and 108 (i.e., not on OPL 112 or capping layer 202).

Figure 2:
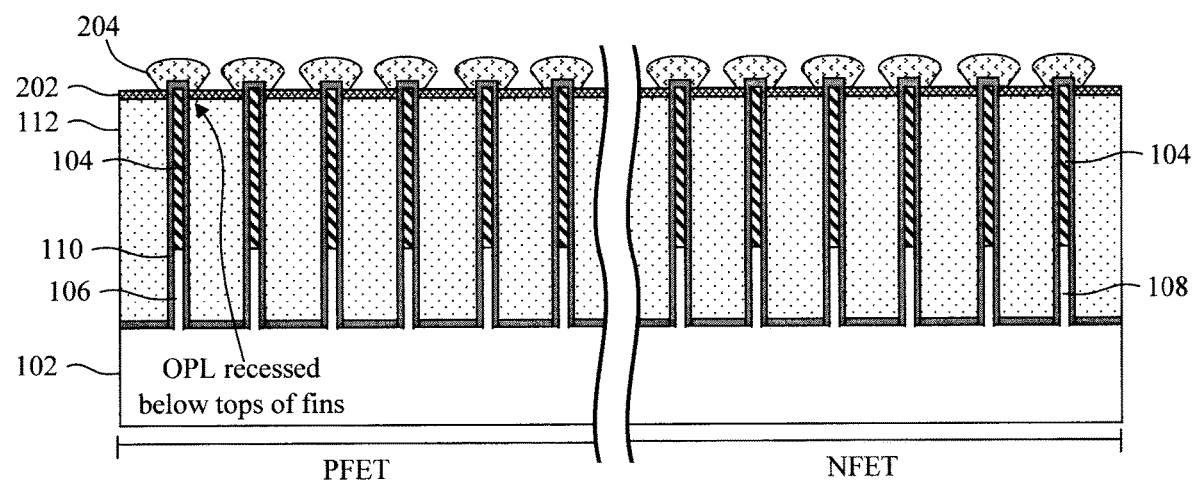
FIG. 2 is a cross-sectional diagram illustrating the first OPL having been recessed below tops of fin hardmasks/liner, a first capping layer having been formed on the surface of the recessed first OPL in between the tops of the fin hardmasks/liner, and first hardmask caps having been formed selectively on the fin hardmasks/liner at the tops of first/second fins according to an embodiment of the present invention.
Figure 3:
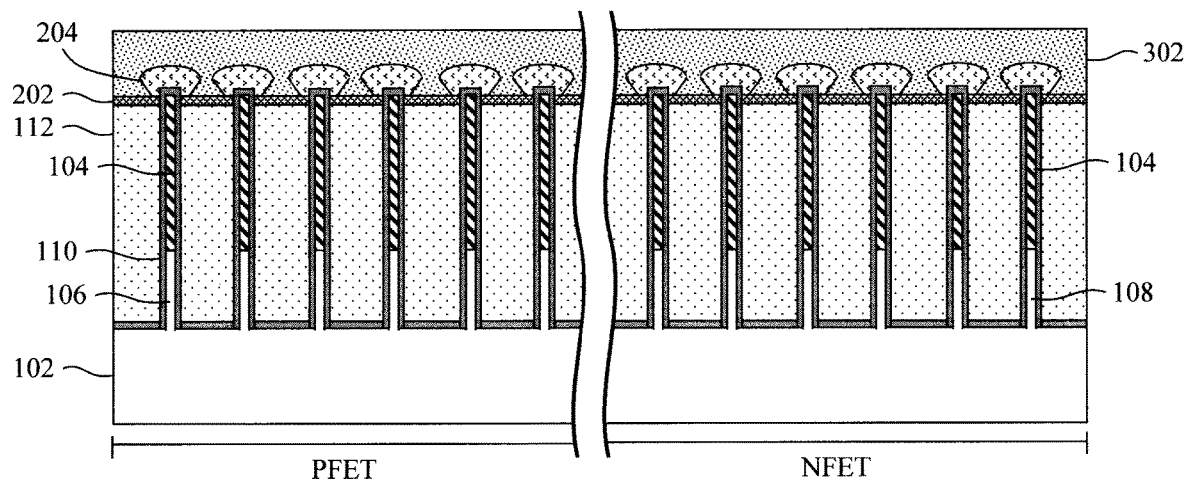
FIG. 3 is a cross-sectional diagram illustrating a second OPL having been deposited onto the first OPL over the hardmask caps according to an embodiment of the present invention.

Namely, as shown in FIG. 2 (first) hardmask caps 204 are next formed selectively on the fin hardmasks 104/liner 110 at the tops of fins 106 and 108. Based on the above-described process, the OPL 112 and capping layer 202 are below the hardmask caps 204. Suitable materials for the hardmask caps 204 include, but are not limited to, dielectric materials such as silicon oxide (SiOx), silicon nitride (SiN), silicon oxynitride (SiON) and/or silicon oxycarbonitride (SiOCN). A process such as plasma-enhanced atomic layer deposition (PEALD) can be employed to deposit the material for hardmask caps 204. As provided above, since the surface of OPL 112 is rendered hydrophobic by capping layer 202, the deposition of this hardmask cap material onto OPL 112 will be suppressed. As such, the hardmask caps 204 will form only on the fin hardmasks 104/liner 110 at the tops of fins 106 and 108 as shown in FIG. 2. As highlighted above, these hardmask caps 204 will serve to protect the underlying hardmasks 104/liner 110 during the full OPL open and subsequent etch processes such as the pre-epi clean that is performed prior to bottom source and drain epitaxy. Thus, the utility of the intermediate structures shown in the figures where the hardmask caps are selectively placed on the tops of the fin hardmasks prior to OPL open, is that these intermediate structures would lead to the product described by the present method, and thus a better product whereby the hardmask caps compensate for erosion of the fin hardmasks that occurs during OPL open and processes such as the pre-epi clean performed prior to bottom source and drain epitaxy.

A second OPL 302 is then deposited onto the (first) OPL 112 over the hardmask caps 204. See FIG. 3. A casting process such as spin-coating or spray coating can be employed to deposit the OPL 302. Following deposition, the OPL 302 can be planarized using a process such as CMP. This second OPL 302 is needed to protect the underlying fin hardmasks 104/liner 110 over fins 108 during bottom source and drain processing at the base of fins 106.

Figure 4:
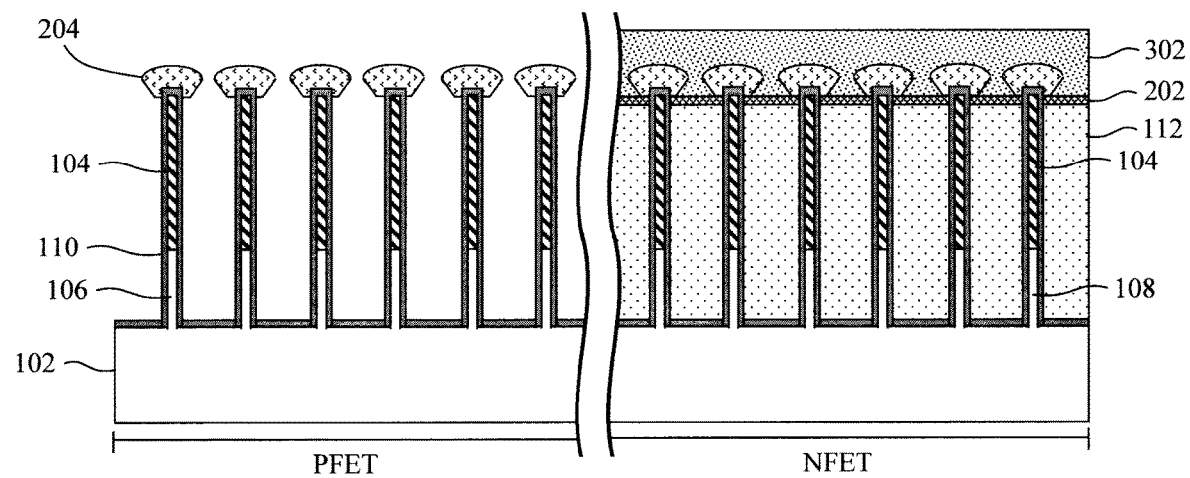
FIG. 4 is a cross-sectional diagram illustrating the first OPL and the second OPL having been opened over the first fins according to an embodiment of the present invention.

Namely, as shown in FIG. 4, standard lithography and etching techniques are next employed to open the OPL 112 and 302 over fins 106. It is notable that the order in which fins 106 and 108 are processed is arbitrary, and embodiments are contemplated herein where fins 108 are processed prior to fins 106. A directional (anisotropic) etching process such as RIE can be employed to open the OPL 112 and 302. Hardmask caps 204 protect the fin hardmasks 104/liner 110 at the tops of fins 106 during the OPL 112 and 302 open.

Figure 5:
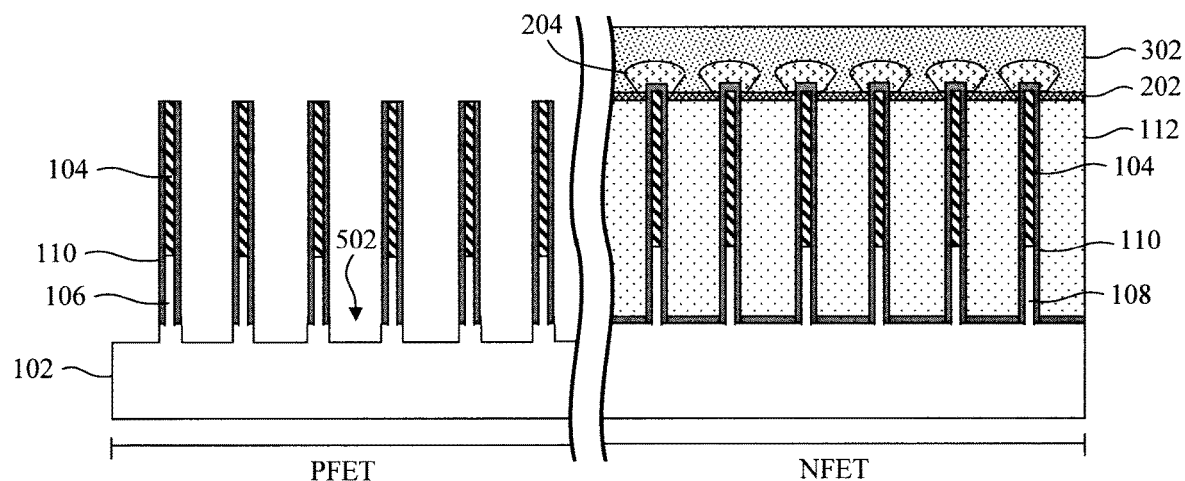
FIG. 5 is a cross-sectional diagram illustrating an etch having been performed to break through the liner at the base of the fins, and an etch having been performed to recess the substrate forming trenches in between the first fins according to an embodiment of the present invention.

The OPL 112 and 302 open enables further processing to be performed at the base of the fins 106, such as the formation of bottom source and drains. To do so, an etch is performed to break through liner 110 at the base of fins 106, exposing the underlying substrate 102. A directional (anisotropic) etching process such as RIE (or a combination of RIE steps depending on the composition of liner 110, see above) can be employed to remove the liner 110 at the base of the fins 106. After breaking through the liner 110 at the base of the fins 106, an etch is performed to recess the substrate 202 forming trenches 502 in between the fins 106. See FIG. 5. Again, a directional (anisotropic) etching process such as RIE can be employed to form the trenches 502 in between the fins 106. As shown in FIG. 5, these etch steps also erode the fin hardmasks 104/liner 110 at the tops of fins 106. However, the hardmask caps 204 placed over the fin hardmasks 104/liner 110 at the tops of fins 106 (now removed by the breakthrough and recess etch) serve to compensate for most of that loss, thereby preserving the majority of the underlying fin hardmasks 104/liner 110 at the tops of fins 106. To look at it another way, without hardmask caps 204 the amount of erosion of the hardmasks 104/liner 110 would be significantly greater at this point in the process even potentially exposing portions of the underlying fins 106.

Figure 6:
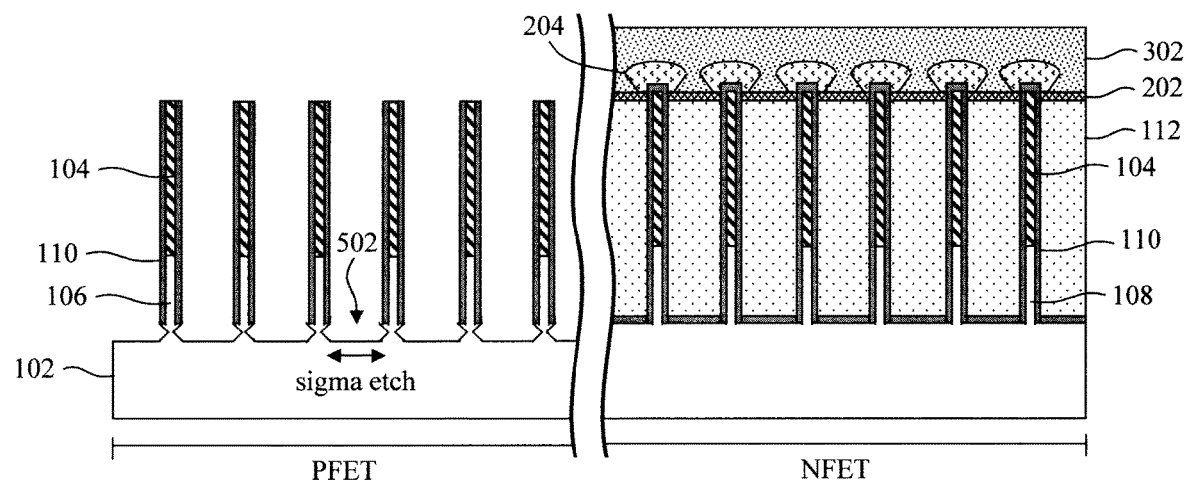
FIG. 6 is a cross-sectional diagram illustrating an etch to laterally expand the trenches having been performed according to an embodiment of the present invention.

With the OPL 112 and 302 still covering/protecting the fins 108, an etch to laterally expand the trenches 502 is next performed. See FIG. 6. A non-directional (i.e., isotropic) wet and/or dry etching process may be employed for this lateral etch of trenches 502 which, as shown in FIG. 6 reduces a width at the base of fins 106. This etch may also be referred to herein as a "sigma etch" since the base of the fins 106 now resemble the letter sigma (Σ). Reducing the width at the base of the fins 106 brings the bottom source and drains (which will be formed in trenches 502) closer to the fins 106 (i.e., the vertical fin channels).

Figure 7:
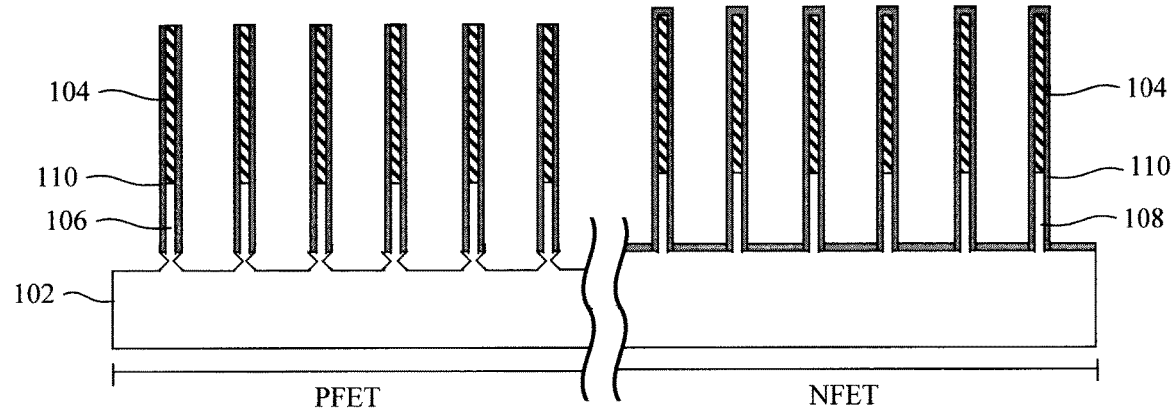
FIG. 7 is a cross-sectional diagram illustrating the remaining first OPL, second OPL and first capping layer having been fully removed from the second fins according to an embodiment of the present invention.
Figure 8:
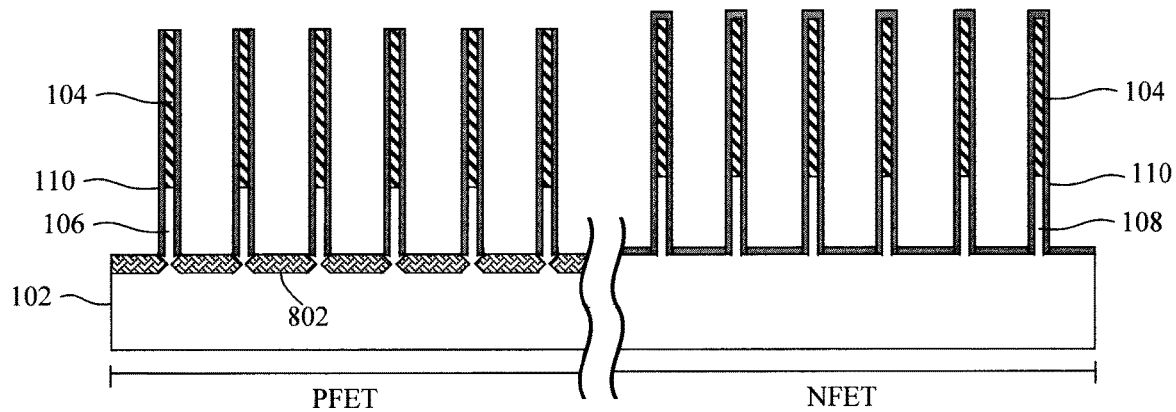
FIG. 8 is a cross-sectional diagram illustrating first (e.g., PFET) bottom source and drains having been formed in the trenches at the base of the first fins according to an embodiment of the present invention.

Following the lateral etch of trenches 502, the remaining OPL 112 and 302 and capping layer 202 are fully removed from the fins 108. See FIG. 7. By way of example only, OPL 112 and 302 and capping layer 202 can be removed using a process such as ashing. Both the fins 106 and 108 are now exposed. Prior to using epitaxy to form the bottom source and drains at the base of the fins 106, a pre-epitaxy clean is performed to clean the surfaces of trenches 502. By way of example only, a pre-epitaxy clean such as SiCoNi™ can be used to remove surface oxides as well as residue and other surface contaminants. This pre-epitaxy clean process will remove a thin layer of the liner 110 and what remains of the hardmask caps 204 over fins 108. Thus, as shown in FIG. 7, the hardmask caps 204 are now likely gone from fins 108 (although it is even better if some of the hardmask caps 204 remain over fins 108). As shown in FIG. 7, even if the hardmask caps are completely removed from fins 108, the hardmasks 104/liner 110 over fins 108 are still higher than the top of the hardmasks 104/liner 110 over fins 106. This is due to prior erosion of the hardmasks 104/liner 110 over fins 106 that occurred during the OPL open (see above). This height differential will be leveraged later on in the process to selectively form hardmask caps over the fins 108 when the process is repeated to form bottom source and drains for the NFET device.

(First) bottom source and drains 802 for the PFET device are then formed in the trenches 502 at the base of the fins 106. See FIG. 8. According to an exemplary embodiment, the bottom source and drains 802 are formed from an in-situ doped (i.e., during growth) or ex-situ doped (e.g., via ion implantation) epitaxial material such as epitaxial Si, epitaxial Ge and/or epitaxial SiGe. Epitaxial growth will only occur on the exposed surfaces of the substrate 102. Thus, the epitaxial growth will only happen in the Σ trenches 502 because all other areas are still under dielectric (i.e., fin hardmasks 104/liner 110). See FIG. 8. Suitable n-type dopants include, but are not limited to, phosphorous (P) and/or arsenic (As). Suitable p-type dopants include, but are not limited to, boron (B). As provided above, in the instant example, fins 106 serve as the vertical fin channels of a PFET device. In that case, bottom source and drains can be formed from a p-type doped epitaxial material such as boron-doped SiGe (SiGe:B).

The process is then repeated to form bottom source and drains at the base of the NFET fins 108. To do so, a conformal liner 902 is first deposited onto the fin hardmasks 104/liner 110 over fins 106 and 108. See FIG. 9. This liner 902 serves to cover the bottom source and drains 802, which have already been formed. Namely, as will be described in detail below, both the NFET and PFET areas will be exposed during the formation of the NFET bottom source and drains. Liner 902 will prevent epitaxial growth on the PFET bottom source and drains 802.

A process such as CVD, ALD or PVD can be employed to deposit liner 902. As with liner 110, liner 902 can be formed from a layer or a stack of layers. The same, non-limiting, examples of oxide and nitride dielectric materials for liner 110 also apply to liner 902. For instance, in one exemplary embodiment, liner 902 is formed from an oxide liner material such as SiOx or a nitride liner material such as SiN. In that case, the (single layer) liner 110 has a thickness of from about 5 nm to about 10 nm and ranges therebetween. In another exemplary embodiment, the liner 902 contains a stack of materials configured, e.g., as an oxide/nitride/oxide (e.g., SiOx/SiN/SiOx) or nitride/oxide/nitride (SiN/SiOx/SiN) stack. In that case, each layer of the liner 902 stack has a thickness of from about 2 nm to about 4 nm and ranges therebetween.

Figure 9:
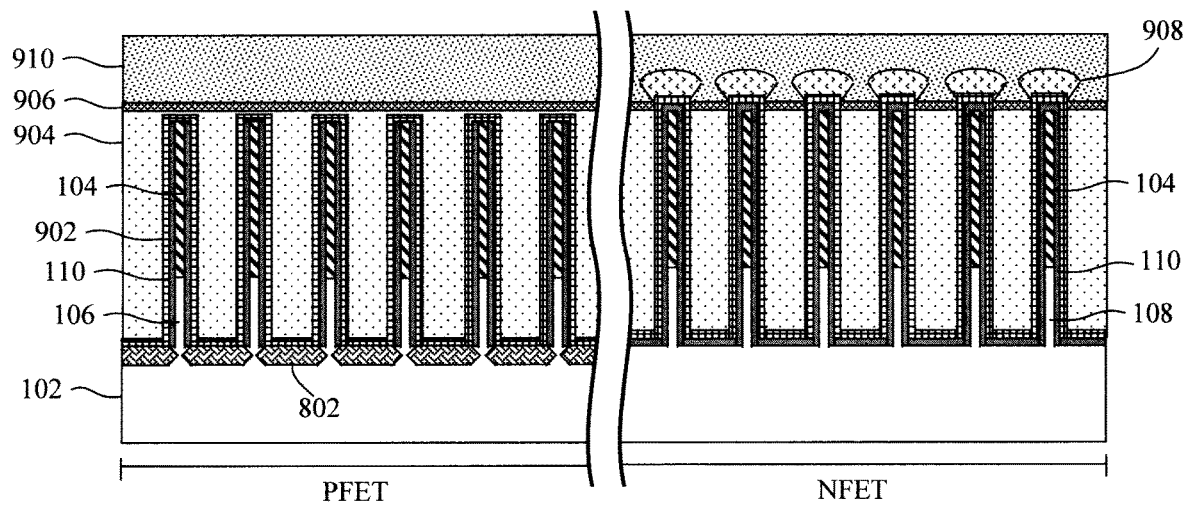
FIG. 9 is a cross-sectional diagram illustrating a conformal liner having been deposited onto the fin hardmasks/liner over the first/second fins and covering the first bottom source and drains, the first/second fins having been surrounded/buried in a third OPL, the third OPL having been recessed exposing the hardmasks/liner over the second fins, a second capping layer having been formed on the surface of the recessed third OPL in between the tops of the fin hardmasks/liner over the second fins, second hardmask caps having been formed selectively on the exposed fin hardmasks/liner at the tops of the second fins, and a fourth OPL having been deposited onto the third OPL over the second hardmask caps according to an embodiment of the present invention.

The steps for forming the NFET bottom source and drains follow the same basic flow as described above, just performed on the opposite fins 108. Thus, for brevity, some steps illustrated in multiple figures above may be consolidated into a single figure. As shown in FIG. 9, the fins 106 and 108 are next surrounded/buried in a (third) OPL 904. A casting process such as spin-coating or spray coating can be employed to deposit the OPL 904 onto the fins 106 and 108 over liner 902. Following deposition, the OPL 904 can be planarized using a process such as CMP.

In the same manner as above, the OPL 904 is then recessed. However, at this stage in the process, the hardmasks 104/liner 110/liner 902 over fins 108 are higher than the top of the hardmasks 104/liner 110/liner 902 over fins 106 due to the difference in erosion from earlier steps (see above). Thus, after recessing the OPL 904 only the hardmasks 104/liner 110/liner 902 over fins 108 are exposed (i.e., the hardmasks 104/liner 110/liner 902 over fins 106 remain buried in OPL 904). See FIG. 9. According to an exemplary embodiment, the OPL 904 is recessed below the tops of hardmasks 104/liner 110/liner 902 over fins 108 using an $O_2/SO_2$-based plasma etching process. In order to enable selective formation of hardmask caps only on the fin hardmasks 104/liner 110/liner 902 at the tops of fins 108 (i.e., and not on the recessed OPL 904), a (second) capping layer 906 is next formed on the surface of the recessed OPL 904 in between the tops of the fin hardmasks 104/liner 110/liner 902 over fins 108. See FIG. 9.

As above, according to an exemplary embodiment, the capping layer 906 is formed by selectively grafting a polymer monolayer (i.e., a layer one atom thick) onto the surface of the recessed OPL 904 in between the tops of the fin hardmasks 104/liner 110/liner 902 over fins 108 (i.e., not on the exposed surfaces of the fin hardmasks 104/liner 110/liner 902 over fins 108) using a polymer brush technique. According to an exemplary embodiment, the capping layer 906 is formed from a polymer brush/SAM material which is formed with a functional head group that binds to pendant groups the OPL 904 such as alkyne groups and has an organic tail having one or more hydrophobic repeating units such alkene, styrene and/or methyl styrene moieties. A casting process such as spin-coating can be employed to deposit a coating of this polymer brush material onto recessed OPL 904 which will self-assemble into a monolayer (as the capping layer 906) coating the recessed OPL 904.

As described above, these polymer brush materials modify the surface energy properties of the OPL 904 to which they are grafted. Namely, these polymer brush materials render the surface of OPL 904 hydrophobic, thereby suppressing the chemical deposition of the dielectric materials that will be used for the NFET hardmask caps (see below). Thus, the NFET hardmask caps will only form on the exposed fin hardmasks 104/liner 110/liner 902 at the tops of fins 108 (i.e., not on OPL 904 or capping layer 906).

Specifically, as shown in FIG. 9 (second) hardmask caps 908 are next formed selectively on the exposed hardmasks 104/liner 110/liner 902 at the tops of fins 108. As provided above, hardmasks 104/liner 110/liner 902 at the tops of fins 106 remain buried in OPL 904. As provided above, suitable hardmask cap materials include, but are not limited to, dielectric materials such as SiOx, SiN, SiON and/or SiOCN. A process such as PEALD can be employed to deposit the material for hardmask caps 908. As provided above, since the surface of OPL 904 is rendered hydrophobic by capping layer 906, deposition of this hardmask cap material onto OPL 904 will be suppressed. As such, the hardmask caps 908 will form only on the exposed fin hardmasks 104/liner 110/liner 902 at the tops of fins 108 as shown in FIG. 9. Hardmask caps 908 will serve to protect the underlying hardmasks 104/liner 110/liner 902 over fins 108 during the full OPL open and subsequent etch processes such as the pre-epi clean that is performed prior to bottom source and drain epitaxy.

A fourth OPL 910 is then deposited onto the (third) OPL 904 over the hardmask caps 908. See FIG. 9. A casting process such as spin-coating or spray coating can be employed to deposit the OPL 910. Following deposition, OPL 910 can be planarized using a process such as CMP. This fourth OPL 910 is used to protect the underlying fin hardmasks 104/liner 110/liner 902 over the fins 106 during the NFET bottom source and drain processing at the base of fins 108.

Figure 10:
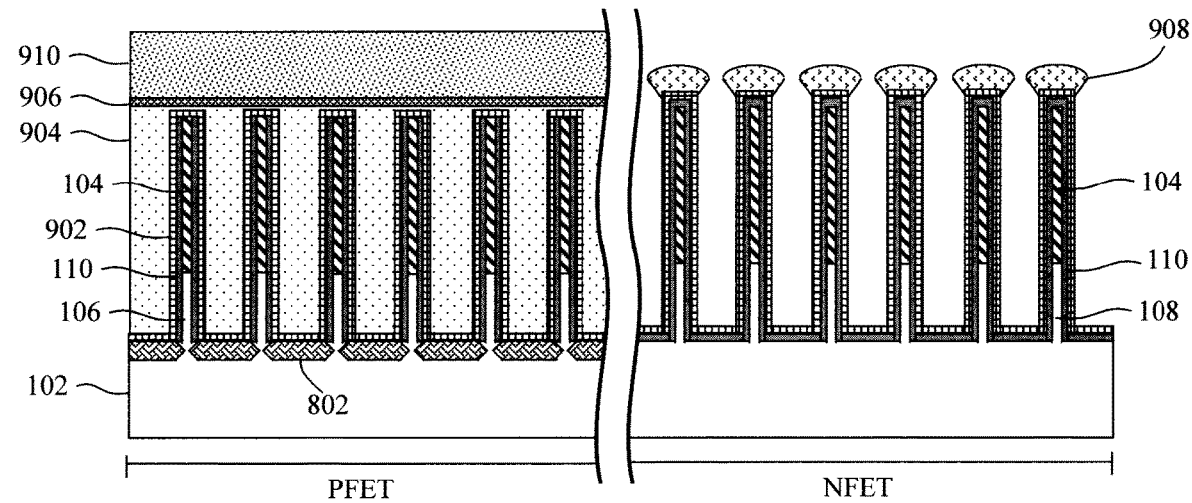
FIG. 10 is a cross-sectional diagram illustrating the third OPL and the fourth OPL having been opened over the second fins according to an embodiment of the present invention.

Namely, as shown in FIG. 10, standard lithography and etching techniques are next employed to open the OPL 904 and 910 over fins 108. A directional (anisotropic) etching process such as RIE can be employed to open the OPL 904 and 910. The OPL 904 and 910 open enables further processing to be performed at the base of the fins 108, such as the formation of bottom source and drains.

Figure 11:
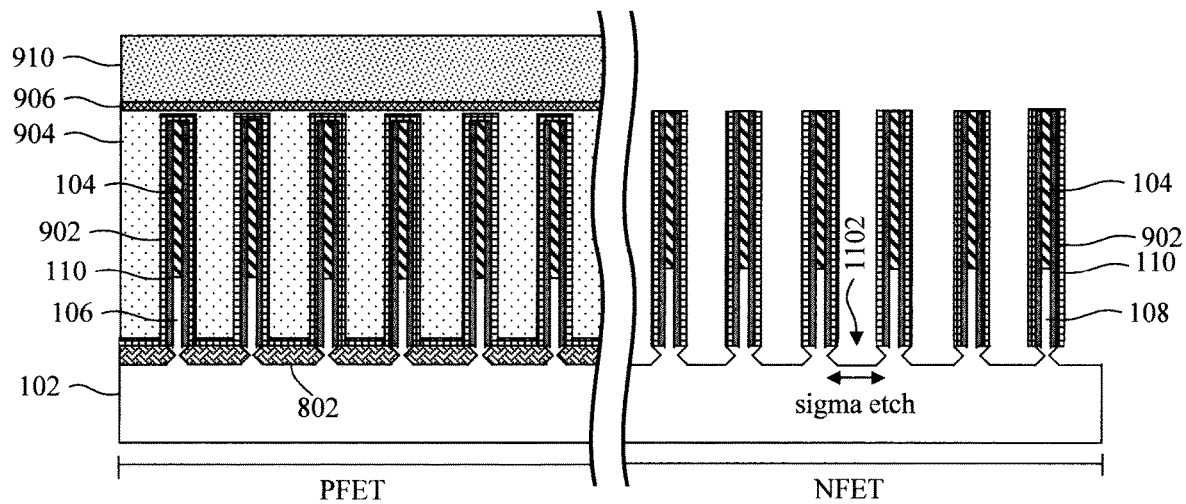
FIG. 11 is a cross-sectional diagram illustrating an etch to laterally expand the trenches having been performed according to an embodiment of the present invention.
Figure 12:
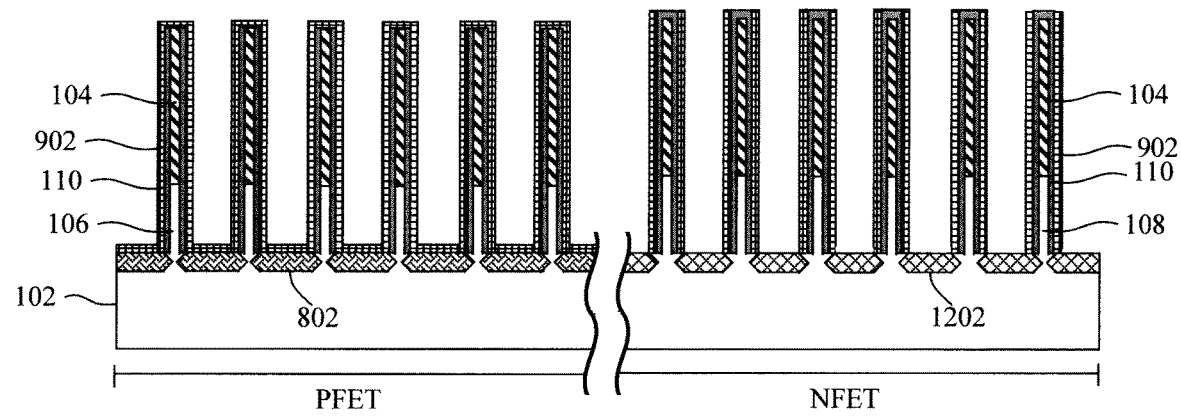
FIG. 12 is a cross-sectional diagram illustrating the remaining third OPL and fourth OPL, and second capping layer having been removed from the first fins, and second (e.g., NFET) bottom source and drains having been formed in the trenches at the base of the second fins according to an embodiment of the present invention.

To do so, in the same manner as described above, an etch is performed to break through liners 902 and 110 at the base of fins 108, exposing the underlying substrate 102. A directional (anisotropic) etching process such as RIE (or a combination of RIE steps depending on the composition of liners 902 and 110, see above) can be employed to remove the liners 902 and 110 at the base of the fins 108. After breaking through the liners 902 and 110 at the base of the fins 108, an etch is performed to recess the substrate 202 forming trenches 1102 in between the fins 108. See FIG. 11. Again, a directional (anisotropic) etching process such as RIE can be employed to form the trenches 1102 in between the fins 108. As shown in FIG. 11, these etch steps also erode the fin hardmasks 104/liner 110/liner 902 at the tops of fins 108. However, the hardmask caps 908 placed over the fin hardmasks 104/liner 110/liner 902 at the tops of fins 108 (now removed by the breakthrough and recess etch) serve to compensate for most of that loss, thereby preserving the majority of the underlying fin hardmasks 104/liner 110/liner 902 at the tops of fins 108. To look at it another way, without hardmask caps 908 the amount of erosion of the hardmasks 104/liner 110/liner 902 would be significantly greater at this point in the process even potentially exposing portions of the underlying fins 108.

Trenches 1102 are then laterally expanded using a non-directional (i.e., isotropic) wet and/or dry etching process (i.e., a sigma etch) which, as shown in FIG. 11, reduces a width at the base of fins 108 bringing the bottom source and drains (which will be formed in trenches 1102) closer to the fins 108 (i.e., the vertical fin channels). Following this lateral etch of trenches 1102, the remaining OPL 904 and 910, and capping layer 906 are removed from the fins 106. See FIG. 12. By way of example only, OPL 904 and 910, and capping layer 906 can be removed using a process such as ashing. Both the fins 106 and 108 are now exposed. Prior to using epitaxy to form the bottom source and drains at the base of the fins 108, a pre-epitaxy clean is performed to clean the surfaces of trenches 1102. By way of example only, a pre-epitaxy clean such as SiCoNi™ can be used to remove surface oxides as well as residue and other surface contaminants.

Bottom source and drains 1202 for the NFET device are then formed in the trenches 1102 at the base of the fins 108. See FIG. 12. According to an exemplary embodiment, the bottom source and drains 1202 are formed from an in-situ doped (i.e., during growth) or ex-situ doped (e.g., via ion implantation) epitaxial material such as epitaxial Si, epitaxial Ge and/or epitaxial SiGe. Epitaxial growth will only occur on the exposed surfaces of the substrate 102. Thus, the epitaxial growth will only happen in the Σ trenches 1102 because all other areas are still under dielectric (i.e., hardmasks 104/liner 110/liner 902). See FIG. 12. As provided above, suitable n-type dopants include, but are not limited to, P and/or As, and suitable p-type dopants include, but are not limited to, B. As provided above, in the instant example, fins 108 serve as the vertical fin channels of an NFET device. In that case, bottom source and drains can be formed from an n-type doped epitaxial material such as phosphorous-doped Si (Si:P).

It is also possible to place the hardmask caps selectively over the PFET or NFET fins 106 and 108 after the OPL open. See, for example, the alternative embodiment described below by way of reference to FIGS. 13-17. The same general principles as described above are also leveraged here to alter the surface properties of the OPL and to selectively place the hardmask caps at the tops of the fins 106 and 108. A notable difference, however, is that a greater amount of erosion of the hardmasks 104/liner 110 is experienced since a full OPL open is performed prior to placement of the hardmask caps. It is notable that like structures are numbered alike in the instant description and figures.

Figure 13:
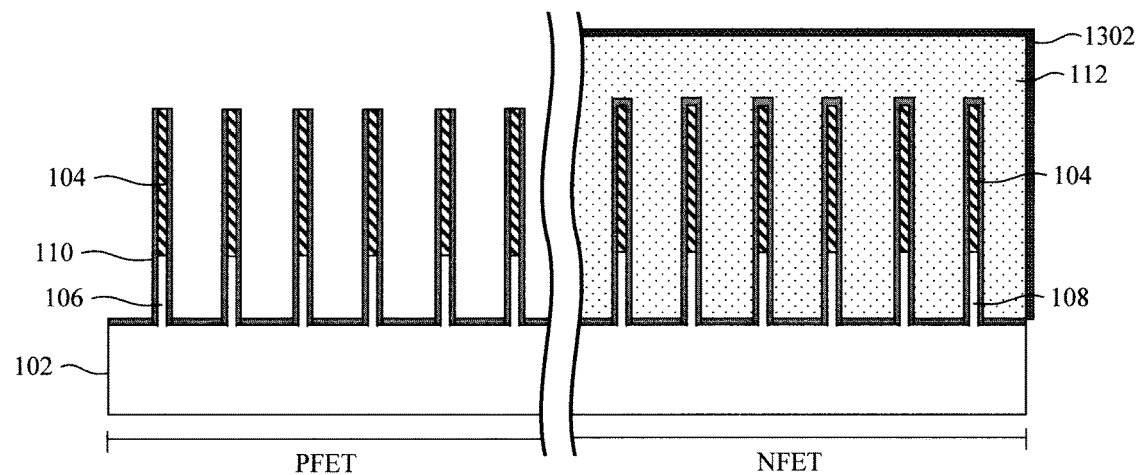
FIG. 13 is a cross-sectional diagram that follows from FIG. 1 illustrating, according to an alternative embodiment, the first OPL having been opened over the first fins, and a first capping layer having been formed on the first OPL according to an embodiment of the present invention.

As shown in FIG. 13, the process begins in the same manner described above, with the patterning of at least one first fin 106 and at least one second fin 108 in the substrate 102 using the fin hardmasks 104 (which serve as the vertical fin channels of PFET and NFET devices, or vice versa), the conformal liner 110 is deposited over the fin hardmasks 104, fins 106 and 108, and on the surface of the substrate 102 in between the fins 106/108, and the fins 106 and 108 are then buried in a (first) OPL 112. Thus, what is depicted in FIG. 13 follows from the structure of FIG. 1. As provided above, the fin hardmasks 104 and liner 110 can be formed from materials such as SiOx, SiN and/or stacked combinations thereof, e.g., an oxide/nitride/oxide (e.g., SiOx/SiN/SiOx) or nitride/oxide/nitride (SiN/SiOx/SiN) stack.

In contrast to the previous embodiment, standard lithography and etching techniques (e.g., using RIE) are next employed to open the OPL 112 over fins 106. See FIG. 13. As shown in FIG. 13, this OPL open erodes the fin hardmasks 104 and liner 110 at the tops of the fins 106. However, the formation of caps at the tops of the fins 106 will next be used to prevent further erosion of the fin hardmasks 104 and liner 110 during subsequent etch steps such as during the pre-epi clean. Thus, the utility of the intermediate structures shown in the figures where the hardmask caps are selectively placed over the PFET or NFET fins 106 and 108 after the OPL open, is that these intermediate structures would lead to the product described by the present method, and thus a better product whereby the hardmask caps compensate for erosion of the fin hardmasks that occurs during OPL open and processes such as the pre-epi clean performed prior to bottom source and drain epitaxy.

To do so, it is desirable to suppress the chemical deposition of the fin hardmask cap material onto the OPL 112. Thus, in the same manner as described above, a monolayer of a polymer brush/SAM material is selectively grafted onto the surface of OPL 112 to form a (first) capping layer 1302. Suitable polymer brush/SAM materials were provided above. As described above, these polymer brush materials render the surface of the OPL 112 hydrophobic, thereby suppressing the chemical deposition of the dielectric materials that will be used for the PFET fin hardmask caps (see below). Thus, the PFET fin hardmask caps will only form on the exposed fin hardmasks 104/liner 110 at the tops of fins 106 (i.e., not on the OPL 112).

Figure 14:
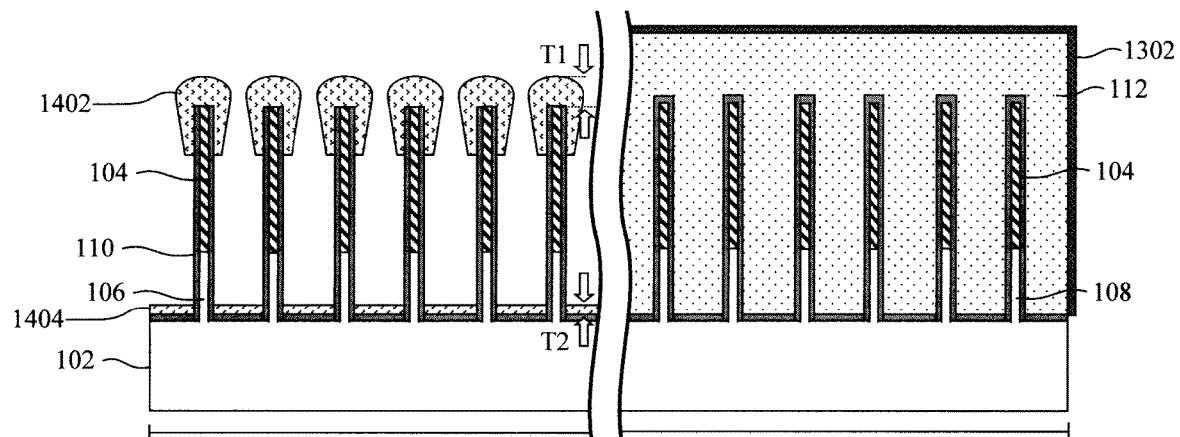
FIG. 14 is a cross-sectional diagram illustrating a first hardmask cap material having been deposited onto the exposed fin hardmasks/liner at the tops of the first fins forming first hardmask caps at the tops of the first fins and a (thinner) layer of the material at the bottom of the first fins according to an embodiment of the present invention.

A process such as PEALD (see above) is then employed to deposit a (first) hardmask cap material (e.g., SiOx, SiN, SiON and/or SiOCN) onto the exposed fin hardmasks 104/liner 110 at the tops of fins 106 forming (first) hardmask caps 1402 at the tops of fins 106 and a (thinner) layer 1404 of the material at the bottom of the fins 106. See FIG. 14. Namely, as shown in FIG. 14, a process such as PEALD results in differential deposition rates of the hardmask cap material on the exposed fin hardmasks 104/liner 110 at the tops of fins 106 versus at the bottoms of the fins 106, whereby a thickness T1 of the fin hardmask caps 1404 at the tops of fins 106 is greater than a thickness T2 of the layer 1404 of the material at the bottom of the fins 106, i.e., T1>T2. This thickness difference between T1 and T2 will ensure that fins 106 remain protected by the hardmask caps 1402 during breakthrough of the layer 1404 at the base of fins 106 for bottom source and drain formation.

Figure 15:
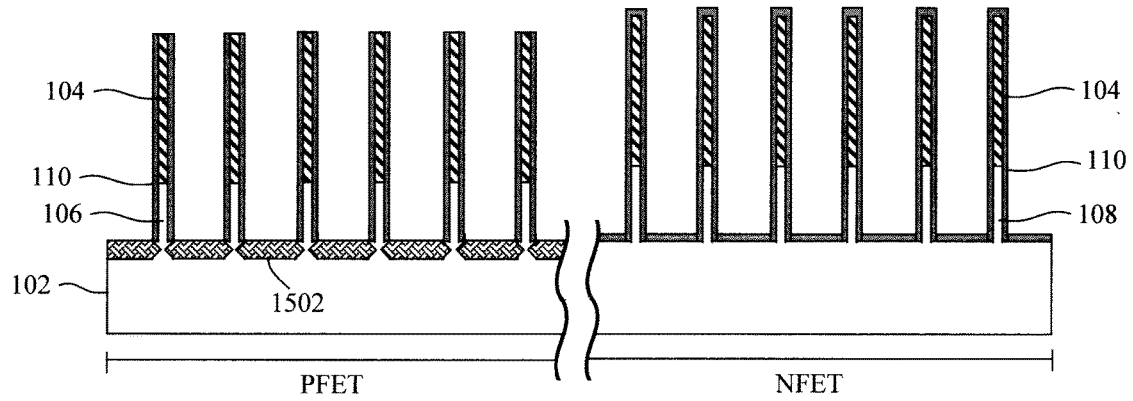
FIG. 15 is a cross-sectional diagram illustrating an etch having been performed to break through liner and layer of fin hardmask cap material at the base of the first fins, an etch having been performed to recess the substrate forming trenches in between the first fins, an etch to laterally expand the trenches having been performed, the remaining first OPL and first capping layer having been fully removed from the second fins, and first (e.g., PFET) bottom source and drains having been formed in the trenches at the base of the first fins according to an embodiment of the present invention.

Namely, the same basic steps as described above are now performed to form PFET bottom source and drains 1502 at the base of fins 106. Thus, for brevity, some steps illustrated in multiple figures above may be consolidated into a single figure. For instance, as provided above, an etch is first performed to break through liner 110 and layer 1404 of hardmask cap material at the base of fins 106, exposing the underlying substrate 102, followed by an etch to recess the substrate 102 forming trenches in between the fins 106. As shown in FIG. 15, these etch steps can further erode the fin hardmasks 104/liner 110 at the tops of fins 106. However, the hardmask caps 1402 placed over the fin hardmasks 104/liner 110 at the tops of fins 106 (now removed by the breakthrough and recess etch) serve to compensate for most of that loss, thereby preserving the majority of the underlying fin hardmasks 104/liner 110 at the tops of fins 106. To look at it another way, without hardmask caps 1402 the amount of erosion of the hardmasks 104/liner 110 would be significantly greater at this point in the process even potentially exposing portions of the underlying fins 106.

A lateral (sigma) etch is used to laterally expand the trenches, thereby reducing the width at the base of the fins 106, after which the remaining OPL 112 and capping layer 1302 are fully removed from the fins 108 using a process such as ashing. Prior to using epitaxy to form the bottom source and drains 1502 at the base of the fins 106, a pre-epitaxy clean is performed. By way of example only, a pre-epitaxy clean such as SiCoNi™ can be used to remove surface oxides as well as residue and other surface contaminants.

(First) bottom source and drains 1502 for the PFET device are then formed in the trenches at the base of the fins 106 from an in-situ doped (i.e., during growth) or ex-situ doped (e.g., via ion implantation) epitaxial material such as epitaxial Si, epitaxial Ge and/or epitaxial SiGe. As provided above, suitable n-type dopants include, but are not limited to, P and/or As, and suitable p-type dopants include, but are not limited to, B. According to an exemplary embodiment, bottom source and drains 1502 are formed from a p-type doped epitaxial material such as SiGe:B.

The process is then repeated to form bottom source and drains at the base of the NFET fins 108. To do so, a conformal liner 1602 is first deposited onto the fin hardmasks 104/liner 110 over fins 106 and 108. See FIG. 16. This liner 1602 serves to cover the bottom source and drains 1502, which have already been formed. As with liner 110, liner 1602 can be formed from a layer or a stack of layers. The same, non-limiting, examples of oxide and nitride dielectric materials for liner 110 also apply to liner 1602. For instance, in one exemplary embodiment, liner 1602 is formed from an oxide liner material such as SiOx or a nitride liner material such as SiN. In that case, the (single layer) liner 1602 has a thickness of from about 5 nm to about 10 nm and ranges therebetween. In another exemplary embodiment, the liner 1602 contains a stack of materials configured, e.g., as an oxide/nitride/oxide (e.g., SiOx/SiN/SiOx) or nitride/oxide/nitride (SiN/SiOx/SiN) stack. In that case, each layer of the liner 1602 stack has a thickness of from about 2 nm to about 4 nm and ranges therebetween.

Figure 16:
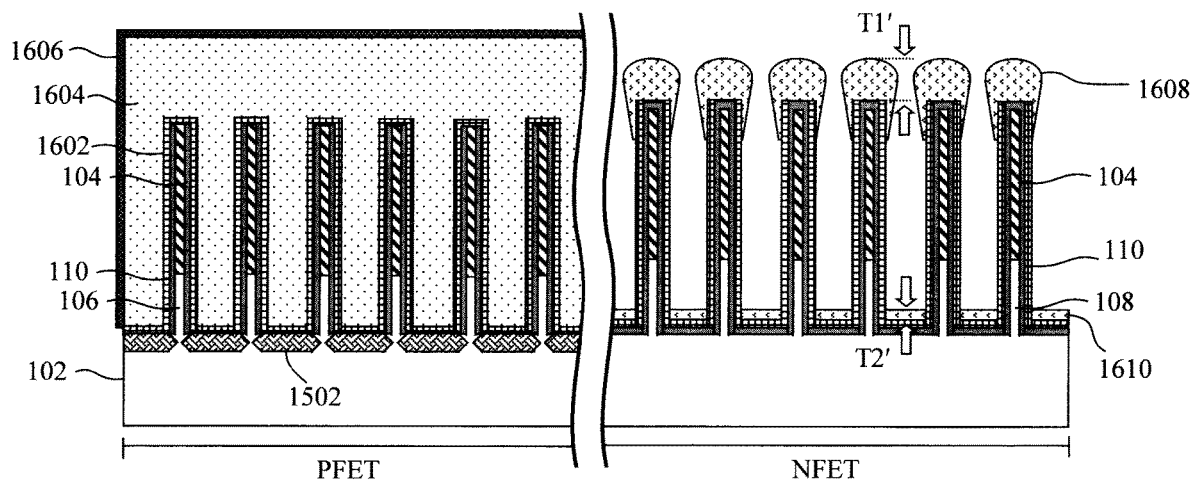
FIG. 16 is a cross-sectional diagram illustrating a conformal liner having been deposited onto the hardmasks/liner over the first/second fins and covering the first bottom source and drains, the first/second fins having been buried in a second OPL which is then opened over the second fins, a second capping layer having been formed on the second OPL, and a second fin hardmask cap material having been deposited onto the exposed fin hardmasks/liner at the tops of the second fins forming second hardmask caps at the tops of the second fins and a (thinner) layer of the material at the bottom of the second fins according to an embodiment of the present invention.

The steps for forming the NFET bottom source and drains follow the same basic flow as described above, just performed on the opposite fins 108. Namely, as shown in FIG. 16, the fins 106 and 108 are next buried in a (second) OPL 1604 which is then opened over fins 108. As shown in FIG. 16, this OPL open erodes the liner 1602 at the tops of the fins 108. However, the formation of hardmask caps at the tops of the fins 108 will next be used to prevent further erosion of the liner 1602 and/or fin hardmasks 104/liner 110 during subsequent etch steps such as during the pre-epi clean.

First however, a monolayer of a polymer brush/SAM material is selectively grafted onto the surface of OPL 1604 to form a (second) capping layer 1606 to suppress the chemical deposition of the fin hardmask cap material onto the OPL 1604. Suitable polymer brush/SAM materials were provided above. As described above, these polymer brush materials render the surface of the OPL 1604 hydrophobic, thereby suppressing the chemical deposition of the dielectric materials that will be used for the NFET fin hardmask caps (see below). Thus, the NFET hardmask caps will only form on the exposed fin hardmasks 104/liner 110/liner 1602 at the tops of fins 108 (i.e., not on the OPL 1604).

A process such as PEALD (see above) is then employed to deposit a (second) hardmask cap material (e.g., SiOx, SiN, SiON and/or SiOCN) onto the exposed fin hardmasks 104/liner 110/liner 1602 at the tops of fins 108 forming (second) hardmask caps 1608 at the tops of fins 108 and a (thinner) layer 1610 of the material at the bottom of the fins 108. As shown in FIG. 16, a process such as PEALD results in differential deposition rates of the hardmask cap material on the exposed fin hardmasks 104/liner 110/liner 1602 at the tops of fins 108 versus at the bottoms of the fins 108, whereby a thickness T1' of the fin hardmask caps 1608 at the tops of fins 108 is greater than a thickness T2' of the layer 1610 of the material at the bottom of the fins 108, i.e., T1'>T2'. This thickness difference between T1' and T2' will ensure that fins 108 remain protected by the hardmask caps 1608 during breakthrough of the layer 1610 at the base of fins 108 for bottom source and drain formation.

Figure 17:
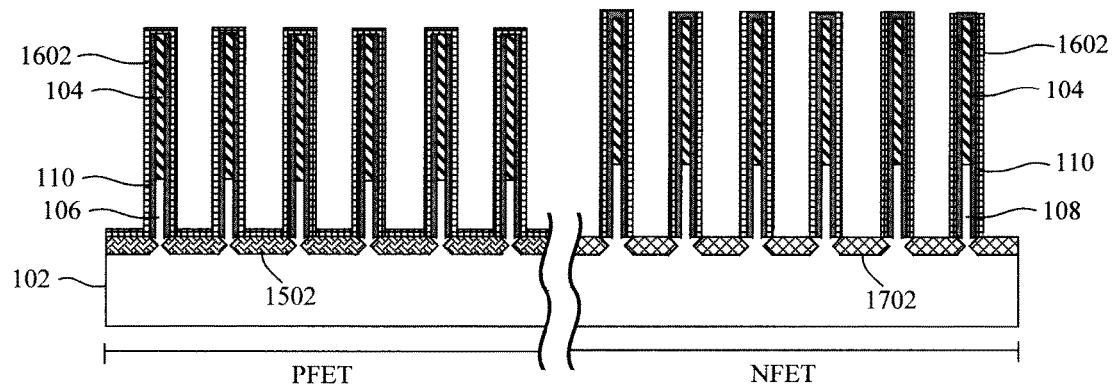
FIG. 17 is a cross-sectional diagram illustrating an etch having been performed to break through liner and layer of fin hardmask cap material at the base of the second fins, an etch having been performed to recess the substrate forming trenches in between the second fins, an etch to laterally expand the trenches having been performed, the remaining second OPL and second capping layer having been fully removed from the first fins, and second (e.g., NFET) bottom source and drains having been formed in the trenches at the base of the second fins according to an embodiment of the present invention.

Namely, an etch is first performed to break through liner 110, liner 1602 and layer 1610 of hardmask cap material at the base of fins 108, exposing the underlying substrate 102, followed by an etch to recess the substrate 202 forming trenches in between the fins 108. As shown in FIG. 17, these etch steps can further erode the fin hardmasks 104/liner 110/liner 1602 at the tops of fins 108. However, the hardmask caps 1608 placed over the fin hardmasks 104/liner 110/liner 1602 at the tops of fins 108 (now removed by the breakthrough and recess etch) serve to compensate for most of that loss, thereby preserving the majority of the underlying fin hardmasks 104/liner 110/1602 at the tops of fins 108. To look at it another way, without hardmask caps 1608 the amount of erosion of the hardmasks 104/liner 110/liner 1602 would be significantly greater at this point in the process even potentially exposing portions of the underlying fins 108.

A lateral (sigma) etch is used to laterally expand the trenches, thereby reducing the width at the base of the fins 108, after which the remaining OPL 1604 and capping layer 1606 are fully removed from the fins 106 using a process such as ashing. Prior to using epitaxy to form the bottom source and drains 1702 at the base of the fins 108, a pre-epitaxy clean is performed. By way of example only, a pre-epitaxy clean such as SiCoNi™ can be used to remove surface oxides as well as residue and other surface contaminants.

(Second) bottom source and drains 1702 for the NFET device are then formed in the trenches at the base of the fins 108 from an in-situ doped (i.e., during growth) or ex-situ doped (e.g., via ion implantation) epitaxial material such as epitaxial Si, epitaxial Ge and/or epitaxial SiGe. As provided above, suitable n-type dopants include, but are not limited to, P and/or As, and suitable p-type dopants include, but are not limited to, B. According to an exemplary embodiment, bottom source and drains 1702 are formed from an n-type doped epitaxial material such as Si:P.

Figure 18:
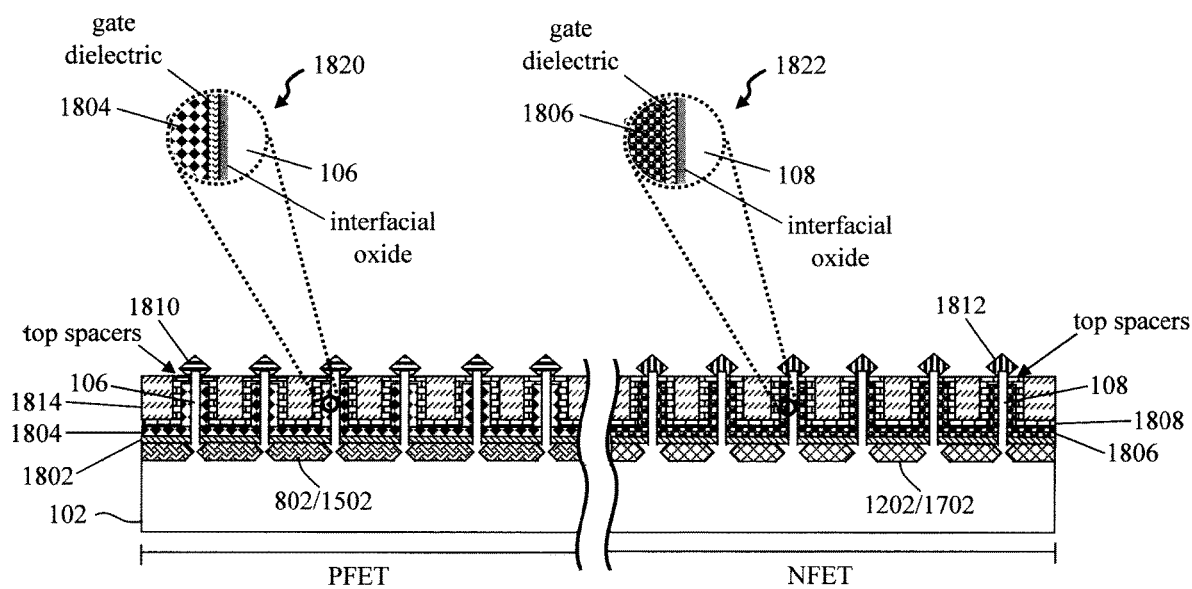
FIG. 18 is a cross-sectional diagram illustrating, with either of the above processes, bottom spacers having been formed on the first/second bottom source and drains, gates having been formed above the bottom spacers alongside the first/second fins, an encapsulation layer having been deposited over the first/second fins and gates which forms top spacers over the gates, and first/second top source and drains having been formed at the tops of the first/second fins over the top spacers according to an embodiment of the present invention.

With whichever of the above-described processes is employed to form the PFET and NFET bottom source and drains 802/1502 and 1202/1702, respectively, the resulting structures can then be processed to form a VTFET having PFET and NFET devices. For instance, as shown in FIG. 18 the fin hardmasks and liner(s) are removed and bottom spacers 1802 are formed on the bottom source and drains 802/1502 and 1202/1702, gates are formed above the bottom spacers 1802 alongside the PFET and NFET fins 106 and 108 containing at least one first workfunction-setting metal 1804 and at least one second workfunction-setting metal 1806, respectively, an encapsulation layer 1808 forms top spacers over the gates, and (first/second) top source and drains 1810 and 1812 are formed at the tops of fins 106 and 108, respectively, over the top spacers.

Suitable materials for the bottom spacers 1802 include, but are not limited to, oxide spacer materials such as silicon oxide (SiOx) and/or silicon oxycarbide (SiOC) and/or nitride spacer materials such as silicon nitride (SiN) and/or silicon-boron-nitride (SiBN). According to an exemplary embodiment, the bottom spacers 1802 are formed using a directional deposition process whereby a greater amount of the spacer material is deposited on horizontal surfaces including on the bottom source and drains 802/1502 and 1202/1702 in between the fins 106 and 108, as compared to vertical surfaces. A timed etch is then used to remove the spacer material deposited on the vertical surfaces, leaving the bottom spacers 1802 as shown in FIG. 18 on the bottom source and drains 802/1502 and 1202/1702 since a greater amount of the spacer material was deposited on the bottom source and drains 802/1502 and 1202/1702 to begin with. By way of example only, a high density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces. According to an exemplary embodiment, bottom spacers 1802 have a thickness of from about 1 nm to about 5 nm and ranges therebetween.

As highlighted above, the gates formed alongside the fins 106 and 108 contain at least one first workfunction-setting metal 1804 and at least one second workfunction-setting metal 1806, respectively. According to an exemplary embodiment, the at least one first workfunction-setting metal 1804 is a p-type workfunction-setting metal, and the at least one second workfunction-setting metal 1806 is an n-type workfunction-setting metal. Suitable n-type workfunction setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction setting metals include, but are not limited to, TiN, TaN, and/or tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

According to an exemplary embodiment, as shown in magnified view 1820, the gates alongside fins 106 include an interfacial oxide formed on the fins 106, a conformal gate dielectric disposed on the fins 106 over the interfacial oxide, and the at least one first workfunction-setting metal 1804 conformally disposed on the gate dielectric. In one exemplary embodiment, the interfacial oxide is SiOx (which may include other chemical elements in it such as nitrogen, germanium, etc.) that is formed selectively on exposed surfaces of fins 106 and 108 by an oxidation process to a thickness of from about 0.3 nm to about 5 nm, and ranges therebetween, e.g., about 1 nm. Similarly, according to an exemplary embodiment, as shown in magnified view 1822 the gates along fins 108 include an interfacial oxide formed on the fins 108, a conformal gate dielectric disposed on the fins 108 over the interfacial oxide, and the second workfunction-setting metal(s) 1806 conformally disposed on the gate dielectric.

According to an exemplary embodiment, the gate dielectric is a high-κ gate dielectric. The term "high-κ" as used herein refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, $HfO_2$ and/or lanthanum oxide ($La_2O_3$). A process such as chemical vapor deposition (CVD), atomic layer deposition (ALD) or physical vapor deposition (PVD) can be used to deposit the gate dielectric. According to an exemplary embodiment, the gate dielectric has a thickness of from about 2 nm to about 5 nm and ranges therebetween.

A process such as CVD, ALD, PVD, evaporation or sputtering can be used to deposit the at least one first workfunction-setting metal 1804 and the at least one second workfunction-setting metal 1806 onto the gate dielectric. According to an exemplary embodiment, the at least one first workfunction-setting metal 1804 and the at least one second workfunction-setting metal 1806 each has a thickness of from about 10 nm to about 20 nm and ranges therebetween.

As shown in FIG. 18, the at least one first/second workfunction-setting metals 1804 and 1806 are recessed at the tops of the fins 106 and 108, respectively. This enables the encapsulation layer 1808 to form top spacers on top of the gates which offset the gates from the top source and drains 1810 and 1812. Similarly, bottom spacers 1802 offset gates from the bottom source and drains 802/1502 and 1202/1702. Suitable materials for encapsulation layer 1808 include, but are not limited to, SiN, silicon boron carbon nitride (SiBCN), silicon oxycarbon nitride (SiOCN), and/or silicon carbon nitride (SiCN). A process such as CVD or ALD can be employed to deposit the encapsulation layer 1808. According to an exemplary embodiment, encapsulation layer 1808 has a thickness of from about 5 nm to about 10 nm and ranges therebetween.

As shown in FIG. 18, fins 106 and 108 and the gates are buried in an interlayer dielectric (ILD) 1814. Suitable materials for the ILD 1814 include, but are not limited to, oxide low-κ materials such as SiOx and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). A process such as CVD, ALD or PVD can be employed to deposit ILD 1814 around the fins 104 and 106 and the gates.

According to an exemplary embodiment, top source and drains 1810 and 1812 are formed from an in-situ doped (i.e., during growth) or ex-situ doped (e.g., via ion implantation) epitaxial material such as epitaxial Si, epitaxial Ge and/or epitaxial SiGe. As provided above, suitable n-type dopants include, but are not limited to, P and/or As, and suitable p-type dopants include, but are not limited to, B. For instance, by way of example only, in one non-limiting exemplary embodiment, top source and drains 1810 are formed from SiGe:B and top source and drains 1812 are formed from Si:P.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a vertical transport field-effect transistor (VTFET) device, the method comprising the steps of:
    patterning fins in a substrate using fin hardmasks, the fins comprising at least one first fin and at least one second fin;
    depositing a liner over the fins and the fin hardmasks;
    selectively forming first hardmask caps over and surrounding both the fin hardmasks and the liner on the at least one first fin, wherein the first hardmask caps on the at least one first fin are present only at a top of the at least one first fin;
    forming first bottom source and drains at a base of the at least one first fin while the fin hardmasks and the liner over the at least one first fin are preserved during formation of the first bottom source and drains by the first hardmask caps;
    selectively forming second hardmask caps over and surrounding both the fin hardmasks and the liner on of the at least one second fin, wherein the second hardmask caps on the at least one second fin are present only at a top of the at least one second fin; and
    forming second bottom source and drains at a base of the at least one second fin while the fin hardmasks and the liner over the at least one second fin are preserved during formation of the second bottom source and drains by the second hardmask caps.

2. The method of claim 1, wherein the first hardmask caps and the second hardmask caps each comprises a material selected from the group consisting of: silicon oxide (SiOx), silicon nitride (SiN), silicon oxynitride (SiON), silicon oxycarbonitride (SiOCN), and combinations thereof.

3. The method of claim 1, wherein the first hardmask caps are selectively formed on the tops of the fin hardmasks and the liner over the at least one first fin and over the at least one second fin.

4. The method of claim 1, further comprising the steps of:
    burying the fins, the fin hardmasks and the liner in a first organic planarizing layer (OPL);
    recessing the first OPL to expose tops of the fin hardmasks and the liner over the at least one first fin and over the at least one second fin; and
    selectively forming the first hardmask caps on the tops of the fin hardmasks and the liner over the at least one first fin and over the at least one second fin exposed by the recessing of the first OPL.

5. The method of claim 4, further comprising the step of:
selectively forming a first capping layer on the first OPL between the tops of the fin hardmasks and the liner, wherein the first capping layer is configured to render a surface of the first OPL hydrophobic thereby suppressing deposition of the first hardmask caps on the first OPL, and wherein the first capping layer comprises a polymer brush self-assembled material comprising a functional head group that binds to the first OPL, and an organic tail having one or more hydrophobic repeating units selected from the group consisting of: alkene moieties, styrene moieties, methyl styrene moieties, and combinations thereof.

6. The method of claim 4, further comprising the steps of:
depositing a second OPL onto the first OPL over the first hardmask caps; and
opening the first OPL and the second OPL over the at least one first fin to enable formation of the first bottom source and drains at the base of the at least one first fin.

7. The method of claim 6, further comprising the steps of:
fully removing the first OPL and the second OPL from the fins after formation of the first bottom source and drains;
burying the fins, the fin hardmasks and the liner in a third OPL;
recessing the third OPL to expose the tops of the fin hardmasks and the liner over the at least one second fin; and
selectively forming the second hardmask caps on the tops of the fin hardmasks and the liner over the at least one second fin exposed by the recessing of the third OPL.

8. The method of claim 7, further comprising the step of:
selectively forming a second capping layer on the third OPL between the tops of the fin hardmasks and the liner over the at least one second fin, wherein the second capping layer is configured to render a surface of the third OPL hydrophobic thereby suppressing deposition of the second hardmask caps on the third OPL, and wherein the second capping layer comprises a polymer brush self-assembled material comprising a functional head group that binds to the third OPL, and an organic tail having one or more hydrophobic repeating units selected from the group consisting of: alkene moieties, styrene moieties, methyl styrene moieties, and combinations thereof.

9. The method of claim 7, further comprising the steps of:
depositing a fourth OPL onto the third OPL over the second hardmask caps; and
opening the third OPL and the fourth OPL over the at least one second fin to enable formation of the second bottom source and drains at the base of the at least one second fin.

10. The method of claim 1, further comprising the steps of:
burying the fins, the fin hardmasks and the liner in a first organic planarizing layer (OPL);
opening the first OPL over the at least one first fin;
selectively forming a first capping layer on the first OPL that has been opened over the at least one first fin, wherein the first capping layer is configured to render a surface of the first OPL hydrophobic thereby suppressing deposition of a first material on the first OPL, and wherein the first capping layer comprises a polymer brush self-assembled material comprising a functional head group that binds to the first OPL, and an organic tail having one or more hydrophobic repeating units selected from the group consisting of: alkene moieties, styrene moieties, methyl styrene moieties, and combinations thereof; and
depositing, with a differential deposition rate, the first material on the tops of the fin hardmasks and the liner over the at least one first fin to form the first hardmask caps having a thickness $T1$ that is greater than a thickness $T2$ of a layer of the first material deposited at a bottom of the at least one first fin.

11. The method of claim 1, further comprising the steps of:
burying the fins, the fin hardmasks and the liner in a second organic planarizing layer (OPL);
opening the second OPL over the at least one second fin;
selectively forming a second capping layer on the second OPL that has been opened over the at least one second fin, wherein the second capping layer is configured to render a surface of the second OPL hydrophobic thereby suppressing deposition of a second material on the second OPL, and wherein the second capping layer comprises a polymer brush self-assembled material comprising a functional head group that binds to the second OPL, and an organic tail having one or more hydrophobic repeating units selected from the group consisting of: alkene moieties, styrene moieties, methyl styrene moieties, and combinations thereof; and
depositing, with a differential deposition rate, the second material on the tops of the fin hardmasks and the liner over the at least one second fin to form the second hardmask caps having a thickness $T1'$ that is greater than a thickness $T2'$ of a layer of the second material deposited at a bottom of the at least one second fin.

12. The method of claim 1, further comprising the steps of:
forming bottom spacers on the first bottom source and drains and on the second bottom source and drains;
forming gates alongside the at least one first fin and the at least one second fin above the bottom spacers;
forming top spacers over the gates; and
forming first top source and drains at a top of the at least one first fin and second top source and drains at a top of the at least one second fin.

13. A device structure, comprising:
fins on a substrate, the fins comprising at least one first fin and at least one second fin;
fin hardmasks disposed over the fins;
a liner disposed over the fins and the fin hardmasks; and
hardmask caps disposed over and surrounding both the fin hardmasks and the liner on only a top of the at least one first fin, on only a top of the at least one second fin, or on only a top of both the at least one first fin and the at least one second fin.

14. The device structure of claim 13, wherein the hardmask caps comprise a material selected from the group consisting of: SiOx, SiN, SiON, SiOCN, and combinations thereof.

15. The device structure of claim 13, wherein the hardmask caps are disposed over and surrounding both the fin hardmasks and the liner on only a top of both the at least one first fin and the at least one second fin, and wherein the device structure further comprises:
a first organic planarizing layer (OPL) surrounding the fins, the fin hardmasks and the liner, wherein the first OPL is below the hardmask caps over the at least one first fin and over the at least one second fin; and
a capping layer disposed on the first OPL, wherein the capping layer comprises a polymer brush self-assembled material comprising a functional head group that binds to the first OPL, and an organic tail having one or more hydrophobic repeating units selected from the group consisting of: alkene moieties, styrene moieties, methyl styrene moieties, and combinations thereof.

16. The device structure of claim 15, further comprising:
a second OPL disposed on the first OPL over the hardmask caps.

17. The device structure of claim 13, further comprising:
an organic planarizing layer (OPL) disposed over the at least one second fin;
the hardmask caps disposed selectively on top of the fin hardmasks and the liner over the at least one first fin, wherein the hardmask caps have a thickness T1; and
a layer of hardmask cap material having a thickness T2 disposed at a bottom of the at least one first fin, wherein the thickness T1 is greater than the thickness T2.

18. The device structure of claim 17, further comprising:
a capping layer on the OPL, wherein the capping layer comprises a polymer brush self-assembled material comprising a functional head group that binds to the OPL, and an organic tail having one or more hydrophobic repeating units selected from the group consisting of: alkene moieties, styrene moieties, methyl styrene moieties, and combinations thereof.

19. The device structure of claim 13, further comprising:
an organic planarizing layer (OPL) disposed over the at least one first fin;
the hardmask caps disposed selectively on top of the fin hardmasks and the liner over the at least one second fin, wherein the hardmask caps have a thickness T1'; and
a layer of hardmask cap material having a thickness T2' disposed at a bottom of the at least one first fin, wherein the thickness T1' is greater than the thickness T2'.

20. The device structure of claim 19, further comprising:
a capping layer on the OPL, wherein the capping layer comprises a polymer brush self-assembled material comprising a functional head group that binds to the OPL, and an organic tail having one or more hydrophobic repeating units selected from the group consisting of: alkene moieties, styrene moieties, methyl styrene moieties, and combinations thereof.

\* \* \* \* \*